United States Patent
van Halteren

(10) Patent No.: US 8,965,018 B2
(45) Date of Patent: Feb. 24, 2015

(54) POWER SUPPLY VOLTAGE FROM CLASS D AMPLIFIER

(75) Inventor: Aart Zeger van Halteren, Hobrede (NL)

(73) Assignee: Sonion Nederland BV, Amsterdam (NL)

( * ) Notice: Subject to any disclaimer, the term of this patent is extended or adjusted under 35 U.S.C. 154(b) by 252 days.

(21) Appl. No.: 13/332,789

(22) Filed: Dec. 21, 2011

(65) Prior Publication Data
US 2012/0155683 A1     Jun. 21, 2012

Related U.S. Application Data

(60) Provisional application No. 61/425,406, filed on Dec. 21, 2010.

(51) Int. Cl.
  *H04R 25/00*  (2006.01)
  *H04R 3/00*   (2006.01)
  *H03F 3/217*  (2006.01)

(52) U.S. Cl.
  CPC ............. *H04R 3/00* (2013.01); *H03F 3/217* (2013.01); *H04R 2225/33* (2013.01); *H03F 2200/03* (2013.01)
  USPC ............ 381/321; 381/312; 381/104; 381/111

(58) Field of Classification Search
  CPC ...... H04R 3/00; H04R 25/502; H04R 25/505; H04R 25/356; H04R 2225/33; H03F 3/217; H03F 2200/03
  USPC ................. 381/321, 111, 113, 312, 104, 107; 330/251
  See application file for complete search history.

(56) References Cited

U.S. PATENT DOCUMENTS

| | | | |
|---|---|---|---|
| 3,733,445 A | 5/1973 | Sebesta et al. | 179/115 A |
| 4,109,116 A | 8/1978 | Victoreen | 179/107 E |
| 4,447,677 A | 5/1984 | Miyahra et al. | 179/107 R |
| 4,592,087 A | 5/1986 | Killion | 381/68 |
| 4,628,907 A | 12/1986 | Epley | 128/1.6 |
| 4,689,819 A | 8/1987 | Killion | 381/68 |
| 4,807,294 A | 2/1989 | Iwata et al. | 381/190 |
| 4,956,868 A | 9/1990 | Carlson | 381/189 |
| 5,068,901 A | 11/1991 | Carlson | 381/68.6 |
| 5,193,116 A | 3/1993 | Mostardo | 381/69 |
| 5,640,457 A | 6/1997 | Gnecco et al. | 381/322 |

(Continued)

FOREIGN PATENT DOCUMENTS

| | | | | |
|---|---|---|---|---|
| WO | WO 00/14870 A1 | 3/2000 | | H03F 3/38 |
| WO | WO 2010/034337 A1 * | 4/2010 | | H04R 25/00 |

OTHER PUBLICATIONS

Extended European Search Report for European Patent Application No. 11 194 282 dated Mar. 7, 2012 (3 pages).

*Primary Examiner* — Curtis Kuntz
*Assistant Examiner* — Joshua A Kaufman
(74) *Attorney, Agent, or Firm* — Nixon Peabody LLP

(57) ABSTRACT

The present invention relates to a hearing aid comprising a receiver and signal processor circuitry operatively connected hereto. The signal processor circuitry comprises amplifying means (e.g., a Class D amplifier) adapted to generate a switched output voltage for driving the receiver of the hearing aid. Moreover, a power supply unit is included and is adapted to generate a DC output voltage from the switched output voltage. The present invention further relates to an associated method for generating a DC output voltage.

11 Claims, 3 Drawing Sheets

(56) References Cited

U.S. PATENT DOCUMENTS

| | | |
|---|---|---|
| 5,740,261 A | 4/1998 | Loeppert et al. .............. 381/168 |
| 6,462,929 B2 * | 10/2002 | Compton et al. ............. 361/246 |
| 6,563,045 B2 | 5/2003 | Goett et al. ..................... 174/36 |
| 7,003,127 B1 | 2/2006 | Sjursen et al. ................ 381/322 |
| 7,030,689 B2 * | 4/2006 | Leenerts et al. ................ 330/10 |
| 7,065,224 B2 | 6/2006 | Cornelius et al. ............. 381/369 |
| 7,181,035 B2 | 2/2007 | van Halteren et al. ........ 381/322 |
| 7,460,681 B2 | 12/2008 | Geschiere et al. ............ 381/324 |
| 2002/0061113 A1 | 5/2002 | van Halteren et al. ........ 381/322 |
| 2004/0028251 A1 | 2/2004 | Kasztelan et al. ............ 381/315 |
| 2008/0219474 A1 * | 9/2008 | Deruginsky et al. .......... 381/111 |

* cited by examiner

POWER SUPPLY VOLTAGE FROM CLASS D AMPLIFIER

REFERENCE TO RELATED APPLICATIONS

This application claims the benefit of U.S. Provisional Patent Application Ser. No. 61/425,406, filed Dec. 21, 2010, and titled "Power Supply Voltage From Class D Amplifier," which is incorporated herein in its entirety.

FIELD OF THE INVENTION

The present invention relates to a method and an arrangement where a class D amplifier switching signal is used to drive a voltage multiplier. The voltage multiplier generates a DC output voltage suitable for driving other electronic devices. The present invention is of particular relevance in connection with hearing aids.

BACKGROUND OF THE INVENTION

In some situations sensors/actuators that are not normally intended for use in hearing aids may advantageously be applied within hearing aids. Such sensors/actuators typically require a supply voltage that is higher than 1.5 Volt which is the typical supply voltage in hearing aids (ZnO battery).

Typically sensors/actuators are designed for use with Li-Ion rechargeable batteries, which means that such devices work in a range of 1.7 to 5 volts. Moreover, other hearing aid building blocks, such as preamplifiers in microphones, may reach a higher dynamic range if a higher supply voltage is available. In addition, A/D converters or other mixed signal building blocks and possibly bias voltages for (silicon) microphones may take advantage of a higher supply voltage level.

It may be seen as an object of embodiments of the present invention to provide a DC voltage source having a supply voltage level exceeding 1.5 Volt with minimum use of extra circuitry.

It may be seen as a further object of embodiments of the present invention to provide a DC voltage source suitable for applications in hearing aids.

DESCRIPTION OF THE INVENTION

In its broadest aspect the present invention relates to the use of voltage multipliers in environments where only a limited amount of current is needed. In order to drive such voltage multipliers, a voltage generator is needed. The present invention is directed towards a method and an arrangement where an audio amplifier output signal, such as a Class D output signal, is used to drive a voltage multiplier. The resulting DC-voltage may be used as a supply voltage to various devices within a hearing aid.

According to an embodiment of the present invention, a multiplied and rectified version of the signal across the terminals of a receiver that is driven by a Class D amplifier may be fed to a microphone of the hearing aid as a supply voltage. Optionally, a smoothing capacitor and/or active power supply regulator may be required in order to stabilize the rectified voltage prior to feeding it to the microphone. The following advantages are associated with the present invention:
  a) A separate power line for the microphone is avoided.
  b) It is possible to implement a power supply having a higher voltage level which is needed in order to increase the dynamic range of a microphone, a preamplifier, etc.
  c) It is possible to apply alternative IC processes that require higher voltages (such as for example 1.8 Volts) whereby for example memory functionalities may be implemented.
  d) The overload margin may be increased due to a higher supply voltage.
  e) No need for extra switching means.

The above-mentioned objects and advantages are reached by providing, in a first aspect, a hearing aid comprises a receiver, signal processing circuitry, and a power-supply unit. The receiver is adapted to generate an audible output signal. The signal processor circuitry is operatively connected to the receiver. The signal processor circuitry comprises audio amplifying means adapted to generate a switched output voltage for driving the receiver of the hearing aid. The power supply unit is adapted to generate a DC output voltage from the switched output voltage generated by the audio amplifying means.

Thus, the power supply unit is adapted to generate an appropriate DC output voltage, said DC output voltage being available as a supply voltage for devices within the hearing aid. Such devices may include a microphone of the hearing aid.

In order to generate the DC output level, the power supply unit comprises rectifying means, such as for example a diode or an active rectifier. The rectifier means may be arranged to form a voltage multiplier, such as a voltage doubler. Preferably, the power supply unit further comprises filter means adapted to filter or smoothen a rectified voltage. Such filter means may comprise a capacitor for smoothening the rectified voltage. Moreover, the power supply unit may further comprise a voltage multiplier, such as a voltage doubler circuitry. By applying a voltage multiplier, a voltage level exceeding the traditional drive voltage level of 1.5 Volts may be exceeded. As mentioned above, there are several advantages associated with supply voltage levels being higher than 1.5 Volts. Depending on how the voltage multiplier is implemented, a DC output voltage level of 2-10 Volts may be reached.

The hearing aid may further comprise a microphone operatively connected to the signal processor circuitry. The microphone optionally being supplied by the DC output voltage. Preferable, the audio amplifying means includes a class D amplifier.

In a second aspect, the present invention relates to a method for generating a power supply voltage in a hearing aid comprising signal processor circuitry having audio amplifying means. The audio amplifying means is adapted to generate a switched output voltage for driving at least one component, such as a receiver, of the hearing aid. The method comprises the step of generating a DC output voltage from the switched output voltage from the audio amplifying means.

The step of generating the DC output voltage may comprise the step of rectifying the switched output voltage from the audio amplifying means using appropriate rectifying means, such as a diode or an active rectifier. The rectifier means may be arranged to form a voltage multiplier, such as a voltage doubler. Moreover, filtering of the rectified voltage may be advantageous in order to obtain a smooth DC output voltage.

The step of generating the DC output voltage may comprise the step of amplifying the switched output voltage from the audio amplifying means prior to filtering the switched output voltage. Amplification may be achieved by using voltage multiplier, such as a voltage doubler circuitry.

As previously mentioned, a voltage multiplier may generate a voltage level that exceeds the traditional drive voltage level of 1.5 Volts. As mentioned above, there are several advantages associated with supply voltage levels being higher than 1.5 Volts. Depending on how the multiplication step is implemented, a DC output voltage level of 2-10 Volts may be reached.

BRIEF DESCRIPTION OF THE DRAWINGS

The present invention will now be explained in further details with reference to the figures where.

Figure 1:
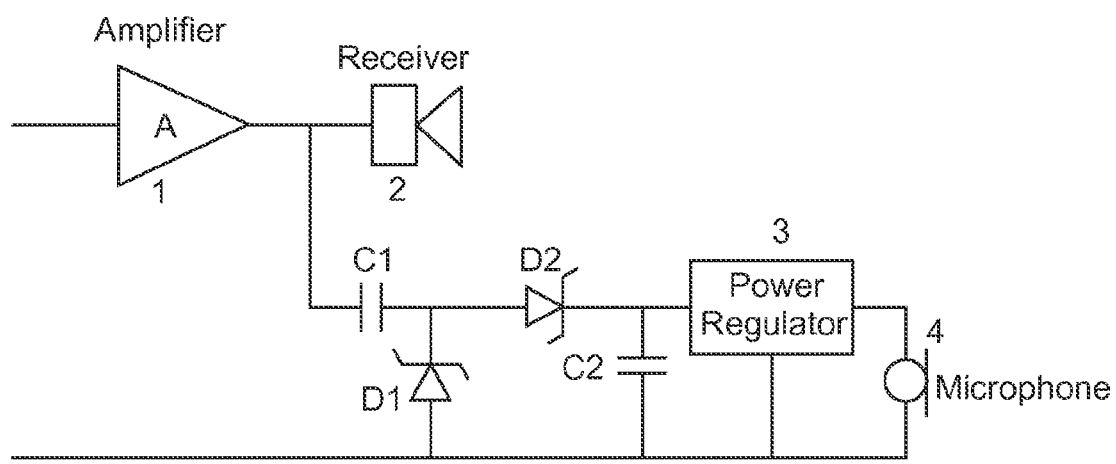
FIG. 1 shows a first embodiment of the present invention.

While the invention is susceptible to various modifications and alternative forms, a specific embodiment have been shown by way of an example in the drawing and will be described in detail herein. It should be understood, however, that the invention is not intended to be limited to the particular form disclosed. Rather, the invention is to cover all modifications, equivalents, and alternatives falling within the spirit and scope of the invention as defined by the appended claims.

DETAILED DESCRIPTION OF THE INVENTION

In its broadest aspect, the present invention relates to a method and an arrangement where a switched output signal from an audio amplifier is used to generate a DC supply voltage. The generation of the DC supply voltage may involve voltage multiplication, rectification, regulation and smoothening in order to generate a DC output voltage suitable for being used as a power supply for other electronic devices or components within, for example, a hearing aids.

It is well known that voltage doubler techniques can generate DC voltage levels of around 2.5 Volts from a standard output voltage of a class D output stage. A passive RC network can be used to lower the noise level whereby a very stable DC voltage with low noise can be generated. Preferably, small capacitors are applied due to the high switching frequency (typically in the range 250 kHz to 10 MHz) of the audio amplifier. Alternatively, an active voltage regulator can be applied to stabilize the DC voltage. The RC network exhibits the intrinsic advantage that it is very inexpensive, easy to implement and it consumes essentially no power.

The fact that a higher supply voltage (higher than 1.5 Volts) becomes available opens a wealth of possibilities in terms of functionalities in that EEPROM, OTP, MEMS sensors, etc., suddenly becomes available. For example, by adding voltage doubling stages two microphones can be fed. Moreover, a positive and a negative power supply can be implemented.

In principle, there is no upper limit for the achievable DC voltage level. Thus, a DC voltage level suitable for being used as a bias voltage for microphones can be generated within the hearing aid. Bias voltages generated in this way would solve the stability issue of electrets in measurement microphones.

Referring now to FIG. 1, an embodiment of the present invention is depicted. As shown in FIG. 1, the arrangement comprises an audio amplifier 1. The audio amplifier is typically a Class D amplifier. The audio amplifier 1 drives the receiver unit 2 by providing a time-switched signal thereto. The frequency of the time-switched signal is typically in the range 250 kHz to 10 MHz.

As depicted in FIG. 1 the time-switched signal is rectified and smoothened by a pair of Schottky diodes D1, D2 and a pair of charge-retention capacitors C1, C2 before being fed into an active power regulator 3. The active power regulator 3 provides the required DC supply voltage to the microphone unit 4.

Figure 2:
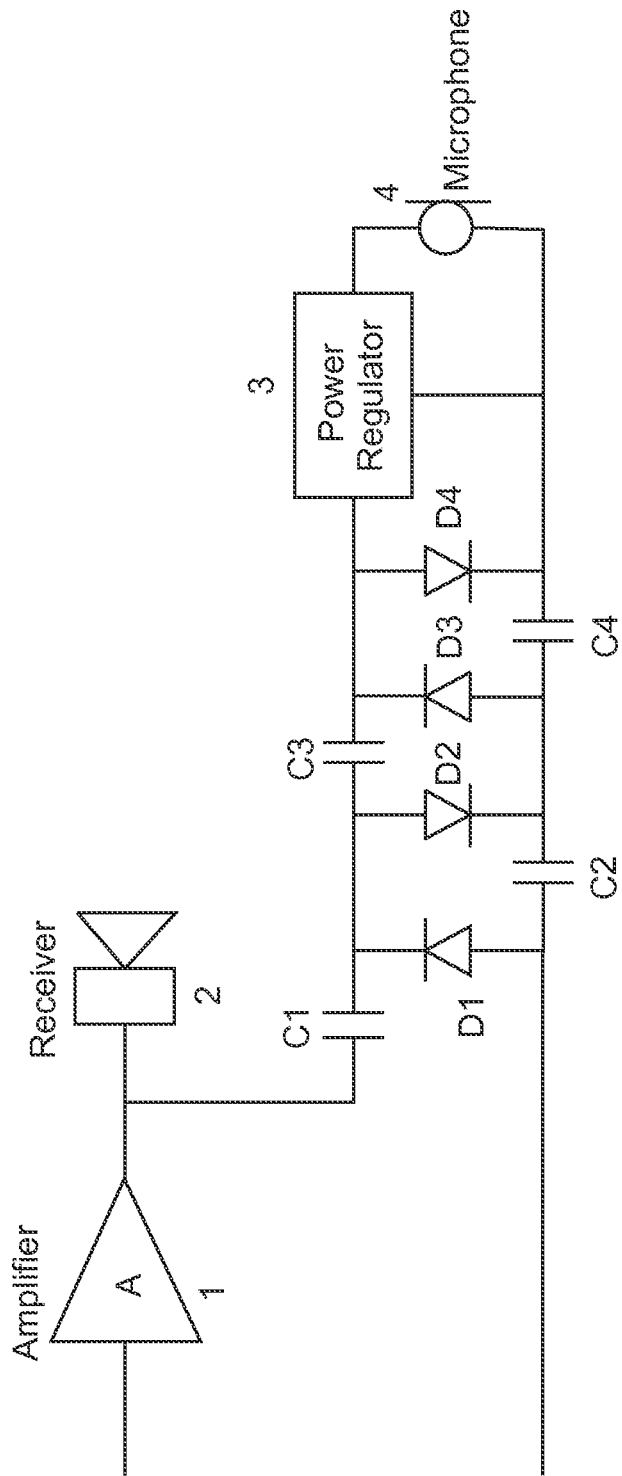
FIG. 2 shows a second embodiment of the present invention.
Figure 3:
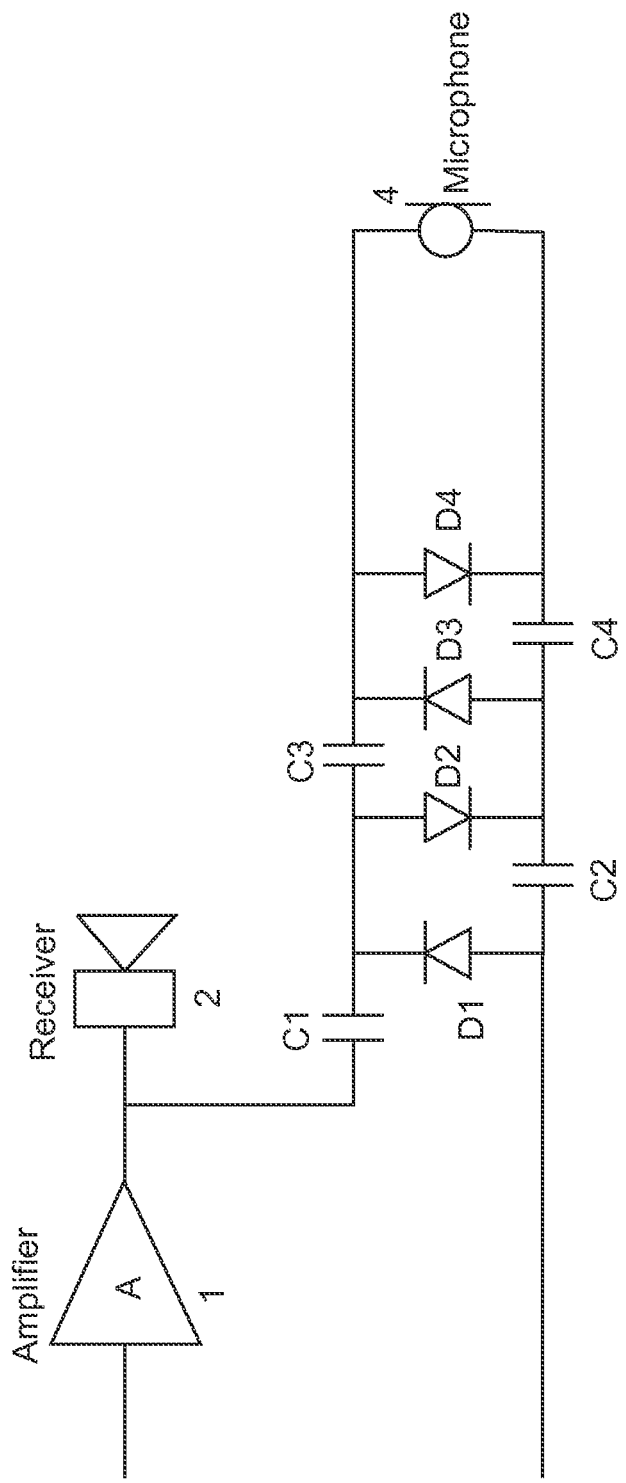
FIG. 3 shows a third embodiment of the present invention.

Referring now to FIG. 2, another embodiment of the present invention is depicted. In FIG. 2, a voltage multiplier formed by diodes D1-D4 and capacitors C1-C4 is incorporated. This voltage multiplier lifts the time-switched signal from the audio amplifier 1 to a desired level. FIG. 3 shows a similar embodiment of the present invention. Compared to FIG. 2, the voltage regulator is omitted in FIG. 3.

By applying the technique of the present invention, multiple voltage levels can be generated within a hearing aid. This may, for example, be achieved by operating a plurality of voltage multipliers in parallel, cf. FIG. 2, where each voltage multiplier generates its unique voltage level. Each of the generated voltage levels is typically tailored to a specific device within the hearing aid. A voltage multiplier (or even a plurality thereof) may advantageously be embedded into the receiver of the hearing aid in order to reach an integrated and space saving solution.

It should be understood, however, that the invention is not intended to be limited to the particular form disclosed in relation to FIGS. 1, 2 and 3. Rather, the invention is to cover all modifications, equivalents, and alternatives falling within the spirit and scope of the invention as defined by the appended claims.

What is claimed is:

1. A hearing aid comprising:
    a receiver adapted to generate an audible output signal;
    an audio amplifier directly connected to the receiver and having an input that receives an input signal, the audio amplifier including a Class D amplifier adapted to generate a switched output voltage based on the input signal for driving the receiver of the hearing aid; and
    a power supply unit including at least one voltage multiplier adapted to generate at least one DC output voltage from the switched output voltage generated by the audio amplifier, the at least one DC output voltage exceeding a battery supply voltage of the hearing aid, the at least one voltage multiplier being formed by diodes and capacitors.

2. A hearing aid according to claim 1, further comprising a microphone operatively connected to the signal processor circuitry.

3. A hearing aid according to claim 1, wherein the power supply unit comprises rectifying means.

4. A hearing aid according to claim 3, wherein the power supply unit further comprises a filter adapted to filter a rectified voltage.

5. A hearing aid according to claim 1, wherein the at least one voltage multiplier includes a voltage doubler circuitry adapted to multiply the output voltage from the audio amplifier.

6. A hearing aid according to claim 1, wherein the DC output voltage is within the range 2-10 Volts.

7. A hearing aid according to claim 1, wherein the DC output voltage supplies a microphone of the hearing aid.

8. A method for generating a power supply voltage in a hearing aid comprising a receiver adapted to generate an audible output signal and an audio amplifier having a Class D amplifier, said audio amplifier being directly connected to the receiver and having an input that receives an input signal, the method comprising the step of:
    generating, by a power supply unit that includes at least one voltage multiplier, at least one DC output voltage from a switched output voltage from the Class D amplifier of the audio amplifier based on the input signal, the at least one DC output voltage exceeding a battery supply voltage of the hearing aid, the at least one voltage multiplier being formed by diodes and capacitors.

9. A method according to claim 8, wherein the step of generating the DC output voltage further comprises the step of amplifying the output voltage by the at least one voltage multiplier.

10. A method according to claim 9, wherein the at least one DC output voltage is within the range 2-10 Volts.

11. A method according to claim 8, wherein the at least one DC output voltage is within the range 2-10 Volts.

* * * * *